United States Patent [19]
Long et al.

[11] Patent Number: 6,153,534
[45] Date of Patent: Nov. 28, 2000

[54] METHOD FOR FABRICATING A DUAL MATERIAL GATE OF A SHORT CHANNEL FIELD EFFECT TRANSISTOR

[75] Inventors: Wei Long, Sunnyvale; Qi Xiang, Santa Clara; Yowjuang W. Liu, San Jose, all of Calif.

[73] Assignee: Advanced Micro Devices, Inc., Sunnyvale, Calif.

[21] Appl. No.: 09/361,826

[22] Filed: Jul. 27, 1999

[51] Int. Cl.$^7$ .................. H01L 21/302; H01L 21/461
[52] U.S. Cl. .................................................. 438/745
[58] Field of Search ................................ 438/745, 756

[56] References Cited

U.S. PATENT DOCUMENTS

| | | | |
|---|---|---|---|
| 5,296,398 | 3/1994 | Noda | 438/179 |
| 5,432,106 | 7/1995 | Hong | 438/257 |
| 5,733,792 | 3/1998 | Masuoka | 438/302 |

OTHER PUBLICATIONS

Michael Shur, Split–Gate Field–Effect Transistor, Appl. Phys. Lett., vol. 54, No. 2, Jan. 9, 1989, pp. 162–164.

Wei Long and Ken K. Chin, Dual Material Gate Field Effect Transistor (DMGFET), IEDM, 1997, pp. 549–552.

Xing Zhou and Wei Long, A Novel Hetero–Material Gate (HMG) MOSFET for Deep–Submicron ULSI Technology, IEEE Transactions on Electron Devices, vol. 45, No. 12. Dec. 1998, pp. 1–3.

S. C. Song, H. F. Luan, Y. Y. Chen, M. Gardner, J. Fulford, M. Allen, And D. L. Kwong, Ultra Thin (< 20 Å) CVD Si3N4 Gate Dielectric for Deep–Sub–Micron CMOS Devices.

P. Dollfus and P. Hesto, Monte Carlo Study of a 50 nm–Dual–Gate HEMT Providing Against Short–Channel Effects, Solid–State Electronics, vol. 36, No. 5, 1993, pp. 711–715.

*Primary Examiner*—Benjamin Utech
*Assistant Examiner*—Lynette T. Umez-Eronini
*Attorney, Agent, or Firm*—Monica H. Choi

[57] ABSTRACT

A dual material gate is effectively fabricated for a field effect transistor having a short channel length of submicron and nanometer dimensions such that disadvantageous short channel effects are minimized. Generally, the method of the present invention includes a step of forming a first material gate portion on a gate dielectric. The first material gate portion has a source side and a drain side, and an aspect of the present invention further includes the step of depositing a spacer dielectric layer on the source side and the drain side of the first material gate portion. An aspect of the present invention also includes the step of implanting heavy ions into the spacer dielectric layer at an angle such that the spacer dielectric layer at the drain side of the first material gate portion is substantially not implanted with the heavy ions. The spacer dielectric layer is then selectively etched such that any portion of the spacer dielectric layer that is implanted with the heavy ions is etched. Thus, the spacer dielectric layer on the drain side of the first material gate portion is not etched, but the spacer dielectric layer on the source side of the first material gate portion is etched. In addition, an aspect of the present invention includes a step of selectively growing a second material gate portion from the first material gate portion that is exposed on the source side of the first material gate portion. In this manner, the dual material gate of the field effect transistor is comprised of the first material gate portion toward the drain of the field effect transistor and the second material gate portion toward the source of the field effect transistor.

15 Claims, 5 Drawing Sheets

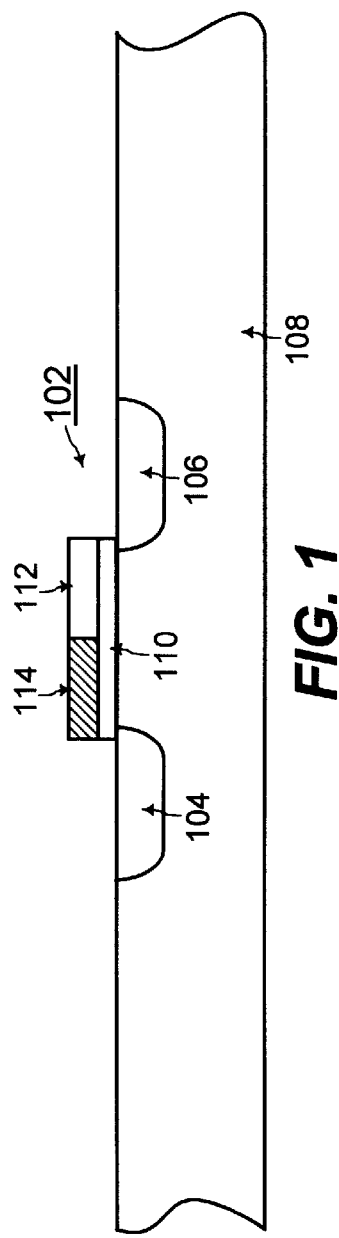
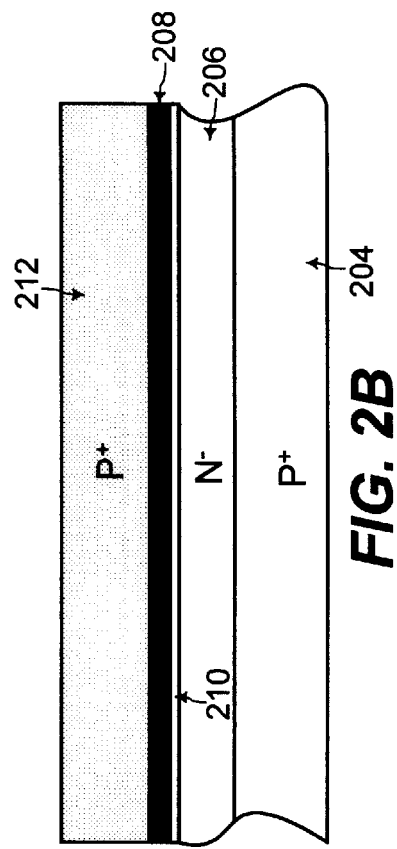
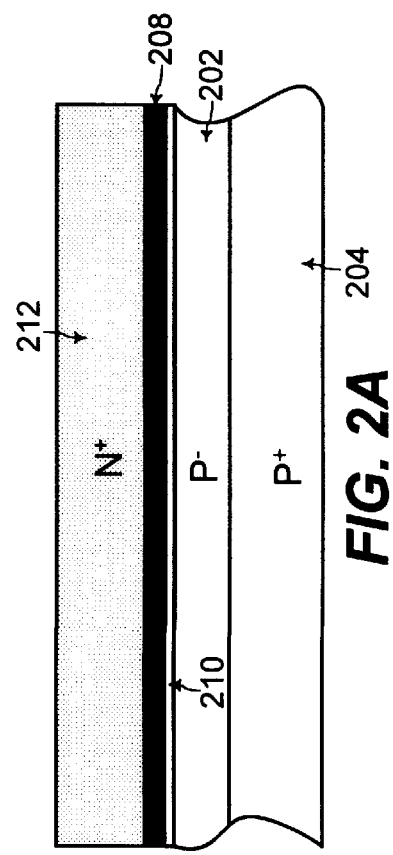

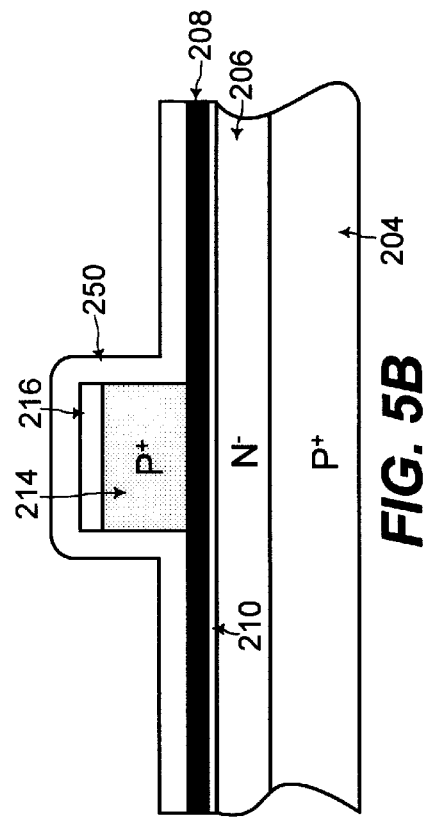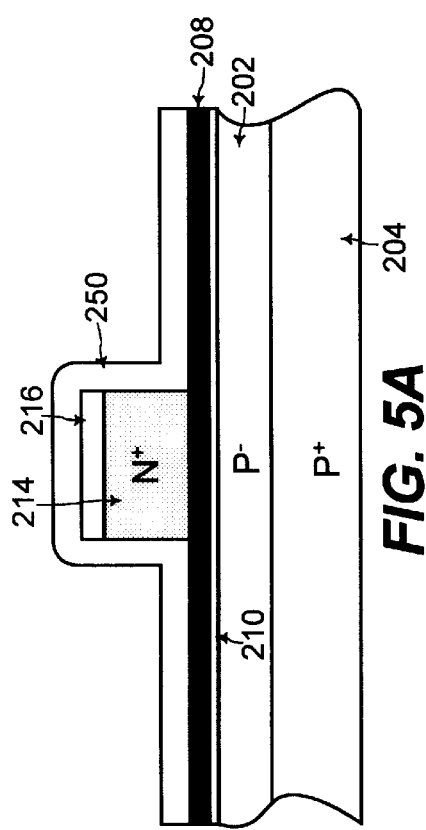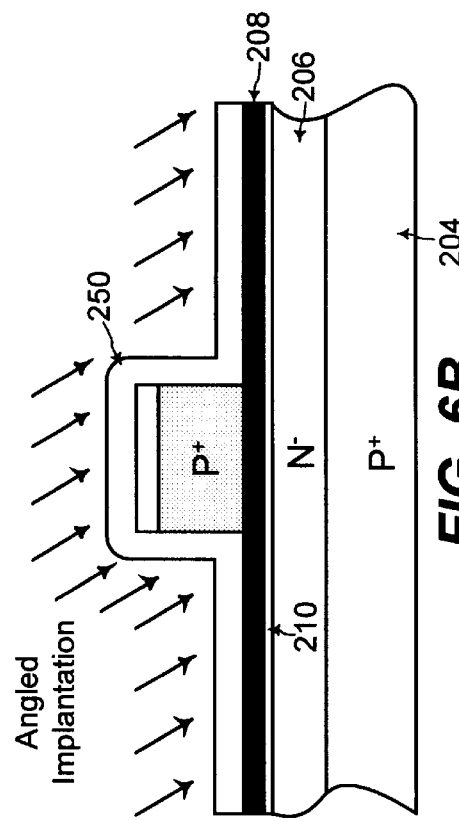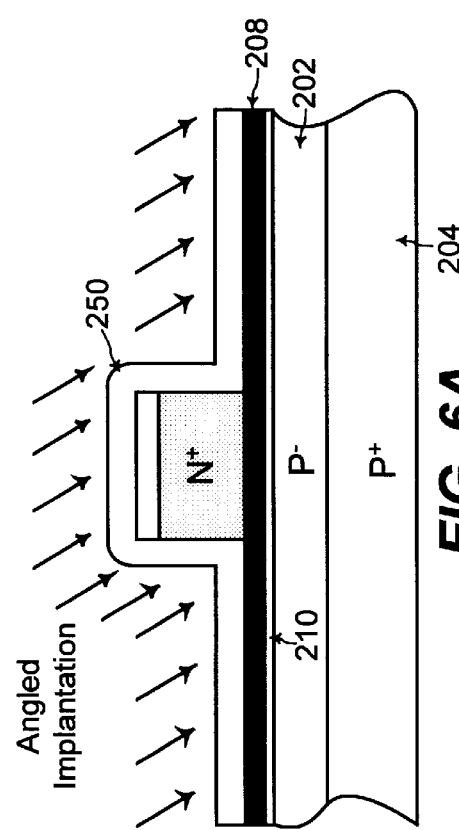

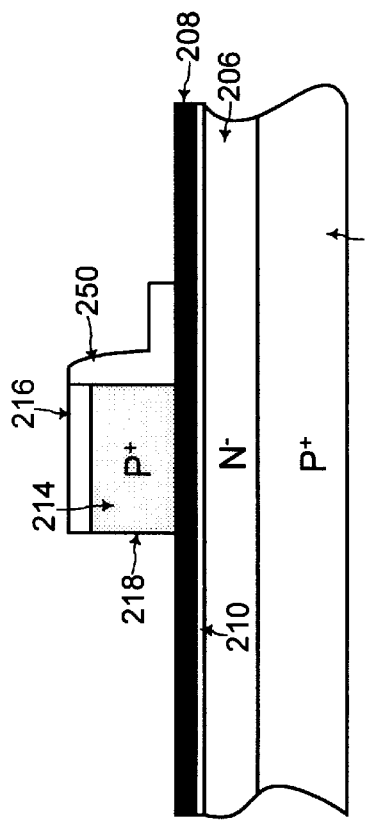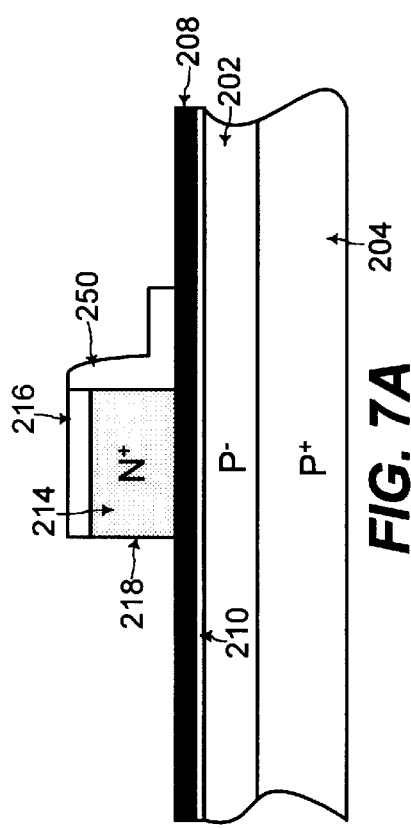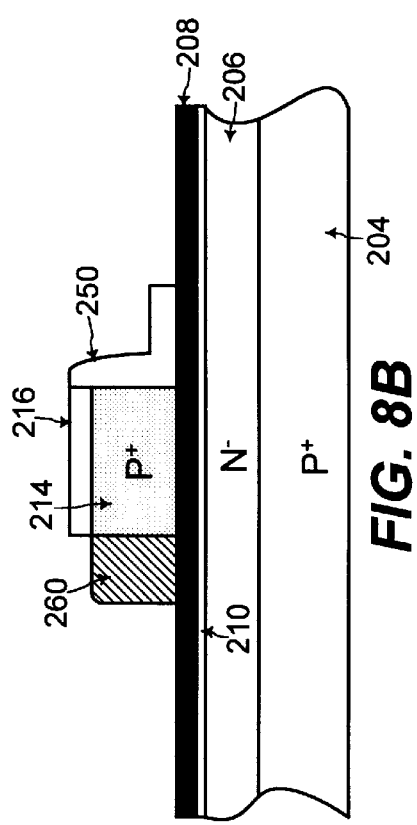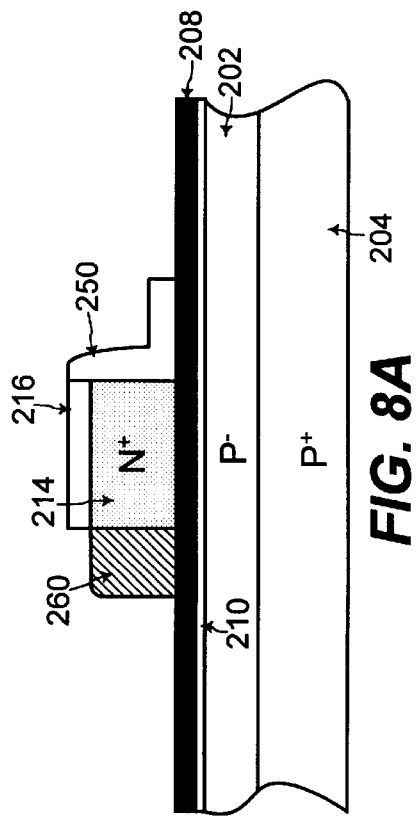

METHOD FOR FABRICATING A DUAL MATERIAL GATE OF A SHORT CHANNEL FIELD EFFECT TRANSISTOR

TECHNICAL FIELD

The present invention relates generally to field effect transistors such as MOSFETs (Metal Oxide Semiconductor Field Effect Transistors) and JFETs (Junction Field Effect Transistors), and more particularly, to a method for fabricating a dual material gate of a short channel field effect transistor for minimizing disadvantageous short channel effects.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Field effect transistors, such as MOSFETs (Metal Oxide Semiconductor Field Effect Transistors), are now widely used within integrated circuits. As the dimensions of a MOSFET are further scaled down to submicron and nanometer dimensions, the short channel length of the MOSFET results in undesired short channel effects, as known to one of ordinary skill in the art. For example, the technical journal articles, *Split-gate Field-effect Transistor* by Michael Shur, Appl. Phys. Lett., 54 (2), pps. 162–164, Jan. 9, 1989, *A Novel Hetero-Material Gate (HMG) MOSFET for Deep-Submicron ULSI Technology* by Xing Zhou and Wei Long, IEEE Transactions on Electron Devices, Vol. 45, No. 12, December 1998, and Dual Material Gate Field Effect Transistor (DMGFET) by Wei Long and Ken K. Chin, IEDM, 1997, pps. 549–52, describe the disadvantageous short channel effects, that result for MOSFETs with short channel lengths of submicron and nanometer dimensions, such as threshold voltage roll-off and DIBL (Drain Induced Barrier Lowering).

Threshold voltage roll-off refers to a decrease in the threshold voltage of a MOSFET as the channel length of the MOSFET decreases at short channel lengths of submicron and nanometer dimensions. DIBL (Drain Induced Barrier Lowering) refers to a lowering of the potential barrier at the source of a MOSFET as the channel length of the MOSFET decreases at short channel lengths of submicron and nanometer dimensions. Threshold voltage roll-off and DIBL (Drain Induced Barrier Lowering) disadvantageously result in higher leakage current for a MOSFET having a short channel length of submicron and nanometer dimensions.

Despite such disadvantageous short channel effects, further reduction of the dimensions of the MOSFET is desired. Thus, the above mentioned technical journal articles describe a dual material gate MOSFET for minimizing such disadvantageous short channels effects for a MOSFET having short channel lengths of submicron and nanometer dimensions.

Referring to FIG. 1, such a dual material gate MOSFET 102 has a source 104 and a drain 106 within a semiconductor substrate 108 similar to a typical MOSFET. In addition, the dual material gate MOSFET 102 has a gate dielectric 110 disposed on a channel region of the MOSFET 102 similar to a typical MOSFET. Unlike a typical MOSFET however, the dual material gate MOSFET 102 has a conductive gate comprised of portions of two separate materials. The dual material gate MOSFET 102 is comprised of a first material gate portion 112 and a second material gate portion 114. The first material gate portion 112 is disposed toward the drain 106 of the dual material gate MOSFET 102, and the second material gate portion 114 is disposed toward the source 104 of the dual material gate MOSFET 102.

As described in the above mentioned technical journal articles, when the dual material gate MOSFET 102 is an N-channel MOSFET, the second material gate portion 114 that is disposed toward the source 104 has a higher work function than that of the first material gate portion 112 that is disposed toward the drain 106 in order to minimize the disadvantageous short channel effects within the MOSFET 102. Conversely, when the dual material gate MOSFET 102 is a P-channel MOSFET, the second material gate portion 114 that is disposed toward the source 104 has a lower work function than that of the first material gate portion 112 that is disposed toward the drain 106 in order to minimize the disadvantageous short channel effects within the MOSFET 102.

Given that a dual material gate may minimize the disadvantageous short channel effects within a field effect transistor, an effective process for fabricating a dual material gate within a field effect transistor is desired.

SUMMARY OF THE INVENTION

Accordingly, a primary object of the present invention is to effectively fabricate a dual material gate of a field effect transistor having a short channel length of submicron and nanometer dimensions such that disadvantageous short channel effects are minimized.

Generally, the method of one aspect of the present invention includes a step of forming a first material gate portion on a gate dielectric. The first material gate portion has a source side and a drain side, and the first material gate portion has a BARC (Bottom Anti-Reflective Coating) layer on top of the first material gate portion. An aspect of the present invention further includes the step of depositing a spacer dielectric layer on the top of the BARC layer, and on the source side and the drain side of the first material gate portion.

An aspect of the present invention also includes the step of implanting heavy ions into the spacer dielectric layer at an angle such that the spacer dielectric layer at the drain side of the first material gate portion is substantially not implanted with the heavy ions. The spacer dielectric layer is then selectively etched such that any portion of the spacer dielectric layer that is implanted with the heavy ions is etched. Thus, the spacer dielectric layer on the drain side of the first material gate portion is not etched, but the spacer dielectric layer on the source side of the first material gate portion is etched. In addition, an aspect of the present invention includes a step of selectively growing a second material gate portion from the first material gate portion that is exposed on the source side of the first material gate portion.

In this manner, the dual material gate of the field effect transistor is comprised of the first material gate portion and the second material gate portion.

The present invention may be used to particular advantage when the field effect transistor is a NMOSFET (N-channel Metal Oxide Semiconductor Field Effect Transistor), and when the second material gate portion has a larger work function than that of the first material gate portion. In that case, the first material gate portion may be $N^+$ doped polysilicon (Si), and the second material gate portion may be $P^+$ doped polysilicon germanium (SiGe).

Alternatively, the present invention may be used to particular advantage when the field effect transistor is a PMOSFET (P-channel Metal Oxide Semiconductor Field Effect Transistor), and the second material gate portion has a smaller work function than that of the first material gate portion. In that case, the first material gate portion may be P+ doped polysilicon (Si), and the second material gate portion may be P+ doped polysilicon germanium (SiGe).

These and other features and advantages of the present invention will be better understood by considering the following detailed description of the invention which is presented with the attached drawings.

BRIEF DESCRIPTION OF THE DRAWINGS

FIG. 1 shows a cross sectional view of a dual material gate MOSFET (Metal Oxide Semiconductor Field Effect Transistor);

FIG. 2A and FIG. 2B show a cross sectional view of a layer of material, such as polysilicon, deposited for forming a first material gate portion of a N-channel MOSFET and a P-channel MOSFET, respectively, according to one embodiment of the present invention;

FIG. 5A and FIG. 5B show a cross sectional view of FIG. 4A and FIG. 4B, respectively, with deposition of a spacer dielectric layer around the first material gate portion, according to one embodiment of the present invention;

FIG. 6A and FIG. 6B show a cross sectional view of FIG. 5A and FIG. 5B, respectively, with selective implantation of heavy ions at an angle such that the heavy ions are not implanted into a drain side of the first material gate portion, according to one embodiment of the present invention;

FIG. 7A and FIG. 7B show a cross sectional view of FIG. 6A and FIG. 6B, respectively, with selective etching of the spacer dielectric layer such that the spacer dielectric layer remains on the drain side of the spacer dielectric layer of the first material gate portion, according to one embodiment of the present invention;

FIG. 8A and FIG. 8B show a cross sectional view of FIG. 7A and FIG. 7B, respectively, with selective growth of a second material gate portion from the exposed surface at a source side of the first material gate portion, according to one embodiment of the present invention;

The figures referred to herein are drawn for clarity of illustration and are not necessarily drawn to scale. Elements having the same reference number in FIGS. 1, 2A, 2B, 3A, 3B, 4A, 4B, 5A, 5B, 6A, 6B, 7A, 7B, 8A, 8B, 9A, 9B, 10A, and 10B refer to elements having similar structure and function.

DETAILED DESCRIPTION

Figure 3A:
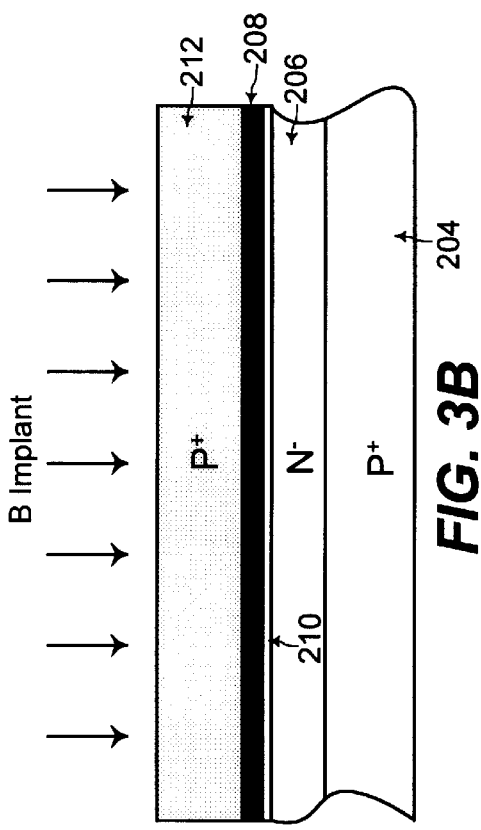
FIG. 3A and FIG. 3B show a cross sectional view of implantation of respective dopant into the layer of material for forming the first material gate portion of FIG. 2A and FIG. 2B, respectively, according to one embodiment the present invention.

In a general aspect of the present invention, a dual material gate is fabricated for a field effect transistor having a short channel length of submicron and nanometer dimensions. Referring to FIG. 2A, for an NMOSFET (N-channel Metal Oxide Semiconductor Field Effect Transistor), a P⁻ doped region 202 is formed on a P+ doped semiconductor substrate 204. Referring to FIG. 2B, for a PMOSFET (P-channel Metal Oxide Semiconductor Field Effect Transistor), a N⁻ doped region 206 is formed on the P+ doped semiconductor substrate 204.

For either the NMOSFET of FIG. 2A or the PMOSFET of FIG. 213, a gate dielectric is deposited on the P⁻ doped region 202 and the N⁻ doped region 206, respectively. The gate dielectric of FIG. 2A and FIG. 2B is a stacked dielectric comprised of a silicon nitride layer (SiN) 208 deposited on top of a buffer silicon dioxide layer ($SiO_2$) 210. Such a stacked dielectric including silicon nitride (SiN) is known to one of ordinary skill in the art as being an amenable gate dielectric for MOSFETs having small channel lengths of submicron and nanometer dimensions. However, other types of gate dielectrics may be used in the practice of the present invention.

For either the NMOSFET of FIG. 2A or the PMOSFET of FIG. 2B, a layer of first material 212 for forming a first material gate portion is deposited on the gate dielectric. For example, the layer of first material 212 may be comprised of polysilicon. However, any other type of material that is amenable for forming the conductive gate of a field effect transistor may be used for the layer of first material 212. The fabrication processes for the layers 202, 206, 208, 210, and 212 of FIG. 2A and FIG. 2B are known to one of ordinary skill in the art of integrated circuit fabrication.

Figure 3B:
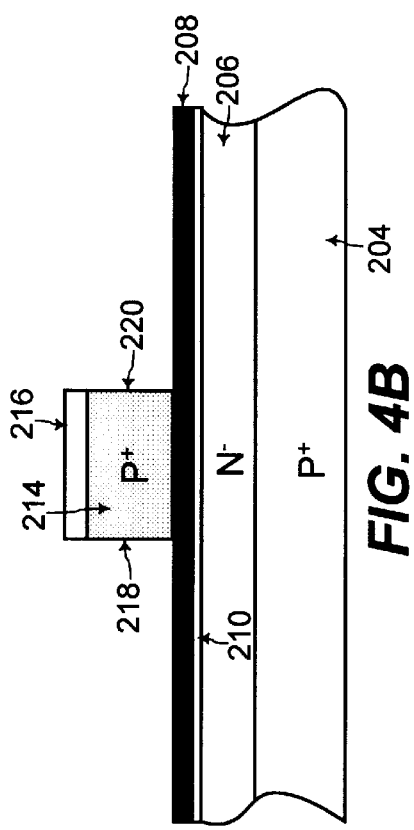

Referring to FIG. 3A and FIG. 3B, the layer of first material 212 is implanted with an appropriate respective dopant for the NMOSFET and the PMOSFET, respectively, to enhance the conductivity of the layer of first material 212. Referring to FIG. 3A, for the NMOSFET, the layer of first material 212 is implanted with a N-type dopant such as arsenic (As) such that the layer of first material 212 is N+ doped. Referring to FIG. 3B, for the PMOSFET, the layer of first material 212 is implanted with a P-type dopant such as boron (B) such that the layer of first material 212 is P+ doped. After the implantation of the dopant, a RTA (Rapid Thermal Anneal) is performed to ensure conformal doping of the layer of first material 212 and for activation of the dopants within the layer of first material 212. Such dopant implantation and RTA processes are known to one of ordinary skill in the art of integrated circuit fabrication.

Figure 4A:
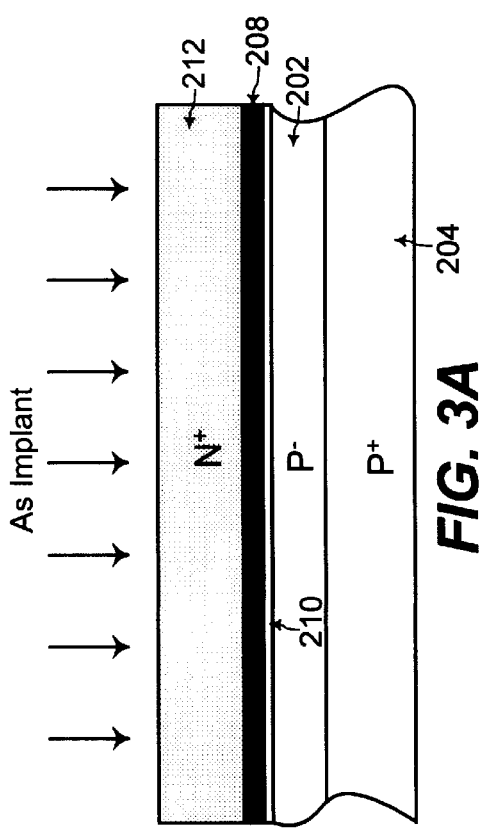
FIG. 4A and FIG. 4B show a cross sectional view of patterning of the layer of material for forming the first material gate portion of FIG. 3A and FIG. 3B, respectively, according to one embodiment of the present invention.
Figure 4B:
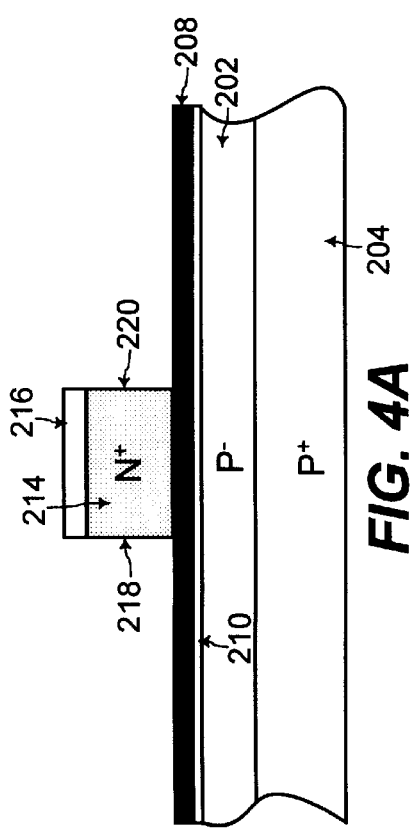

Referring to FIG. 4A and FIG. 4B, the layer of first material 212 is patterned to form a first material gate portion of the NMOSFET and the PMOSFET, respectively. Referring to FIG. 4A, for the NMOSFET, a first material gate portion 214 is patterned from the N+ doped layer of first material 212. Patterning processes such a photolithography and etching processes for forming the first material gate portion 214 for the NMOSFET of FIG. 4A are known to one of ordinary skill in the art of integrated circuit fabrication. In addition, a BARC (Bottom Anti-Reflective Coating) layer 216 is deposited on top of the layer of first material 212 during such a patterning process for improved photolithography resolution during the patterning of the BARC layer 216 and the layer of first material 212. Thus, the BARC layer 216 remains on top of the first material gate portion 214 as shown in FIG. 4A. The BARC layer 216 may be comprised of silicon oxynitride (SiON) for example.

Referring to FIG. 4A, the first material gate portion 214 forms a part of a dual material gate for a field effect transistor, and the first material gate portion 214 has a source side 218 and a drain side 220. A source of the NMOSFET of FIG. 4A is formed toward the left of the source side 218 of the first material gate portion 214 within the P⁻ doped region 202, and a drain of the NMOSFET of FIG. 4A is formed toward the right of the drain side 220 of the first material gate portion 214 within the P⁻ doped region 202.

Similarly for a PMOSFET, referring to FIG. 4B, the first material gate portion 214 is patterned from the P⁺ doped layer of first material 212. The BARC layer 216 remains on top of the first material gate portion 214 as shown in FIG. 4B. The first material gate portion 214 of the PMOSFET of FIG. 4B has the source side 218 and the drain side 220. A source of the PMOSFET of FIG. 4B is formed toward the left of the source side 218 of the first material gate portion 214 within the N⁻ doped region 206, and a drain of the PMOSFET of FIG. 4B is formed toward the right of the drain side 220 of the first material gate portion 214 within the N⁻ doped region 206.

For fabrication of a dual material gate for a field effect transistor, a second material gate portion is selectively formed to the source side 218 of the first material gate portion 214 for both the NMOSFET of FIG. 4A and the PMOSFET of FIG. 4B. For such selective formation of the second material gate portion, selective etching of a spacer dielectric layer is used in the process of an aspect of the present invention. Referring to FIG. 5A and FIG. 5B, a spacer dielectric layer 250 is deposited to cover the top of the BARC layer 216, and the source side 218 and the drain side 220 of the first material gate portion 214 for the NMOSFET and the PMOSFET, respectively. The spacer dielectric layer 250 may be comprised of silicon dioxide for example, and in that case, the spacer dielectric layer 250 may be deposited using CVD (Chemical Vapor Deposition), as known to one of ordinary skill in the art of integrated circuit fabrication.

For selective formation of the second material gate portion on the source side 218 of the first material gate portion 214, the spacer dielectric layer 250 is selectively etched from the source side 218 of the first material gate portion 214. For such selective etching, referring to FIG. 6A and FIG. 6B, an implantation of heavy ions into the spacer dielectric layer 250 is performed at an angle such that the heavy ions are substantially not implanted into the drain side 220 of the first material gate portion 214 of the NMOSFET and the PMOSFET, respectively. The heavy ions may be comprised of nitrogen (N) ions or argon (Ar) ions for example. However, other heavy ions may be used in this angled implantation process in the practice of the present invention.

After such an angled implantation process of FIG. 6A and FIG. 613, referring to FIG. 7A and FIG. 7B, the spacer dielectric layer 250 is selectively etched such that the spacer dielectric layer 250 is etched from the top of the BARC layer 216 and the source side 218 of the first material gate portion 214 while the spacer dielectric layer 250 is substantially not etched from the drain side 220 of the first material gate portion 214.

The etch rate of a portion of the spacer dielectric layer 250 may be significantly affected by whether heavy ions are implanted into that portion of the spacer dielectric layer 250. For example, when the spacer dielectric layer 250 is comprised of silicon dioxide, a hydrogen fluoride (HF) acid solution etches silicon dioxide having heavy ions implanted therein at a significantly faster rate than for silicon dioxide without heavy ions implanted therein. (The applicants have experimentally confirmed that the etch rate, in hydrogen fluoride (HF) acid solution, of silicon dioxide having heavy ions implanted therein is approximately four times greater than that of silicon dioxide without heavy ions implanted therein.)

Because the spacer dielectric layer 250 on top of the BARC layer 216 and the source side 218 of the first material gate portion 214 has heavy ions implanted therein, the spacer dielectric layer 250 at such locations is selectively etched. Conversely, because the spacer dielectric layer 250 at the drain side 220 of the first gate portion 214 substantially does not have heavy ions implanted therein, the spacer dielectric layer 250 at such a location is not etched, as illustrated in FIG. 7A for the NMOSFET and in FIG. 7B for the PMOSFET Referring to FIG. 8A and FIG. 8B, with the spacer dielectric layer 250 asymmetrically covering only the drain side 220 of the first material gate portion 214, a second material gate portion 260 is selectively grown from the first material gate portion 214 that is exposed on the source side 218 of the first material gate portion 214. When the first material gate portion 214 is comprised of polysilicon, the second material gate portion 260 may be comprised of polysilicon germanium (SiGe) that is epitaxially grown from the exposed surface of the polysilicon at the source side 218 of the first material gate portion 214.

The second material gate portion 260 of polysilicon germanium (SiGe) may be epitaxially grown using GSMBE (Gas Source Molecular Beam Epitaxy) and UHVCVD (Ultra High Vacuum Chemical Vapor Deposition) processes. In addition, the second material gate portion 260 of polysilicon germanium (SiGe) may be in-situ doped with boron (B) during the epitaxial growth of the polysilicon germanium such that the polysilicon germanium is P⁺ doped. One of ordinary skill in the art is familiar with such selective growth and in-situ doping processes.

With such selective growth of the second material gate portion 260 of polysilicon germanium, when the first material gate portion 214 is polysilicon, the polysilicon germanium does not grow from the gate dielectric 208, the BARC layer 216, and the spacer dielectric layer 250 remaining on the drain side 220 of the first material gate portion 214. The second material gate portion 260 of polysilicon germanium selectively grows substantially only from the exposed polysilicon surface at the source side 218 of the second material gate portion 214.

Figure 9A:
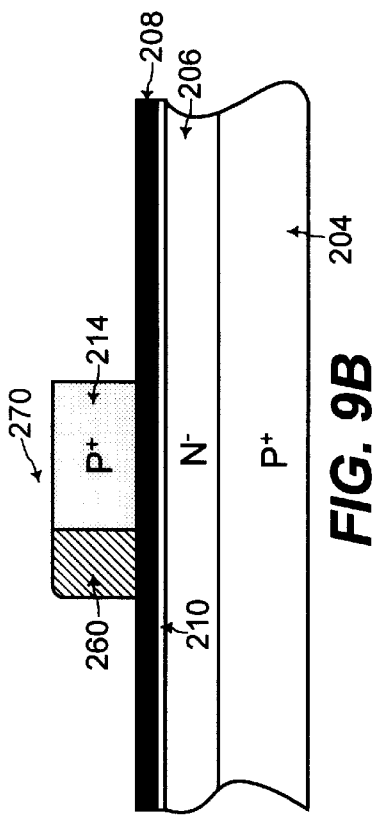
FIG. 9A and FIG. 9B show a cross sectional view of FIG. 8A and FIG. 8B, respectively, with etching of the BARC layer on top of the first material gate portion and the spacer dielectric layer on the drain side of the first material gate portion, according to one embodiment of the present invention.
Figure 9B:
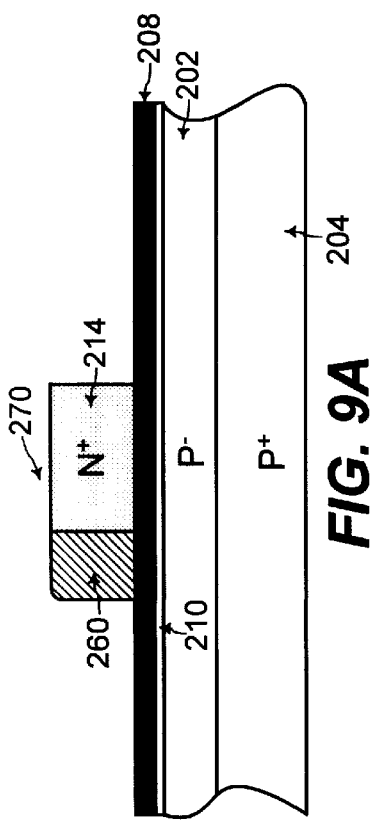

Referring to FIG. 9A and FIG. 9B, after selective growth of the second material gate portion 260 at the source side 218 of the first material gate portion 214, the BARC layer 216 and the spacer dielectric layer 250 at the drain side 220 of the first material gate portion 214 are etched away to result in a dual material gate 270. Referring to FIG. 9A, for the NMOSFET, the dual material gate 270 is formed by the first material gate portion 214 comprised of N⁺ doped polysilicon (Si) and the second material gate portion 260 comprised of P⁺ doped polysilicon germanium (SiGe). For minimizing disadvantageous short channel effects in the NMOSFET of FIG. 9A, the second material gate portion 260 of P⁺ doped polysilicon germanium (SiGe) toward the source of the NMOSFET has a larger work function than that of the first material gate portion 214 of N+ doped polysilicon (Si).

Similarly, referring to FIG. 9B, for the PMOSFET, the dual material gate 270 is formed by the first material gate portion 214 comprised of P+ doped polysilicon (Si) and the second material gate portion 260 comprised of P+ doped polysilicon germanium (SiGe).

For minimizing disadvantageous short channel effects in the PMOSFET of FIG. 9B, the second material gate portion 260 of P+ doped polysilicon germanium (SiGe) toward the source of the PMOSFET has a smaller work function than that of the first material gate portion 214 of P+ doped polysilicon (Si).

In this manner, the present invention is an effective method for fabrication of a dual material gate of a field effect transistor. With the dual material gate described herein, the channel length of the field effect transistor may be scaled down to submicron and nanometer dimensions while disadvantageous short channel effects are minimized.

Figure 10A:
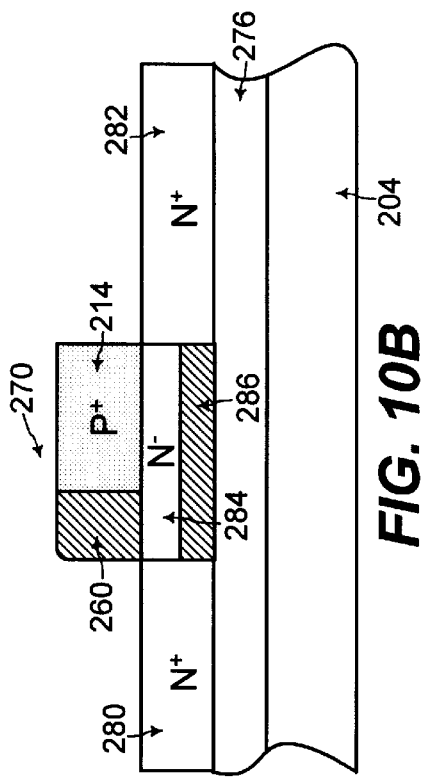
FIG. 10A shows a cross sectional view of a dual material gate fabricated for a JFET (Junction Field Effect Transistor)

The foregoing is by way of example only and is not intended to be limiting. For example, fabrication of the dual material gate for the MOSFET device is by way of example only, and the present invention may be practiced for other types of field effect transistors, as would be apparent to one of ordinary skill in the art of electronics from the description herein. Referring to FIG. 10A, the dual material gate 270 is fabricated as the gate electrode of a JFET (Junction Field Effect Transistor) having a N+ doped source 272 and a N+ doped drain 274 fabricated on a dielectric region 276. The dielectric region 276 may be silicon dioxide for example when fabricated on a silicon semiconductor substrate 204. The dual material gate 270 is fabricated on a N− doped channel 278. The dual material gate 270 may be advantageous for minimizing short channel effects when the JFET of FIG. 10A has short channel lengths of submicron or nanometer dimensions.

Figure 10B:
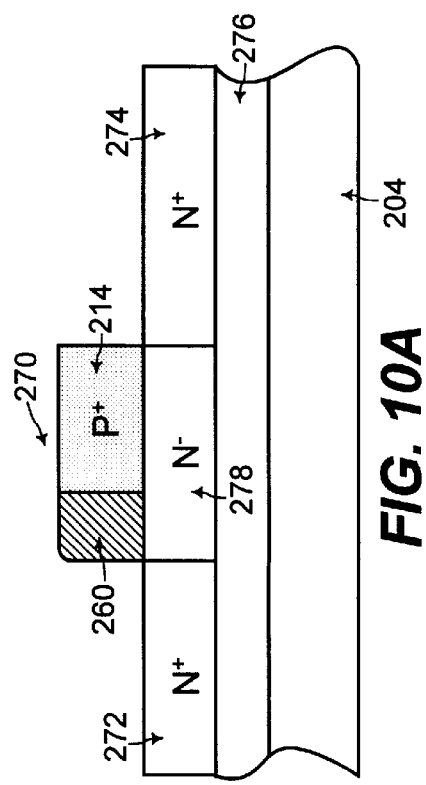
FIG. 10B shows a cross sectional view of a dual material gate fabricated for a HJFET (Heterostructure Junction Field Effect Transistor).

Alternatively, referring to FIG. 10B, the dual material gate 270 is fabricated as the gate electrode of a HJFET (Heterostructure Junction Field Effect Transistor) having a N+ doped source 280 and a N+ doped drain 282 fabricated on the dielectric region 276. The dual material gate 270 is fabricated on a heterostructure channel comprised of a N− doped region 284 and a N+ doped region 286. The N− doped region 284 may be comprised of N− doped polysilicon, and the N+ doped region 286 may be comprised of N+ doped polysilicon germanium, for example. The dual material gate 270 may be advantageous for minimizing short channel effects when the HJFET of FIG. 10B has short channel lengths of submicron or nanometer dimensions.

In addition, the materials used for the first material gate portion 214 and the second material gate portion 260 are by way of example only, and other types of material that are amenable for forming a conductive gate may be used to practice the present invention, as would be apparent to one of ordinary skill in the art from the description herein.

Furthermore, as will be understood by those skilled in the art, the integrated circuit structures described herein may be made or used in the same way regardless of their position and orientation. Accordingly, it is to be understood that terms and phrases such as "on," "side," "left," and "right" as used herein refer to the relative location and orientation of various portions of the structures with respect to one another, and are not intended to suggest that any particular absolute orientation with respect to external objects is necessary or required.

The present invention is limited only as defined in the following claims and equivalents thereof

We claim:
1. A method for fabricating a dual material gate of a field effect transistor, the method including the steps of:
   a. forming a first material gate portion on a gate dielectric, said first material gate portion having a source side and a drain side, and said first material gate portion having a BARC (Bottom Anti-Reflective Coating) layer on top of said first material gate portion;
   B. depositing a spacer dielectric layer on said top of said BARC layer, and on said source side and said drain side of said first material gate portion;
   C. implanting heavy ions into said spacer dielectric layer at an angle such that said spacer dielectric layer at said drain side of said first material gate portion is substantially not implanted with said heavy ions;
   D. selectively etching said spacer dielectric layer wherein any portion of said spacer dielectric layer implanted with said heavy ions is etched, and wherein said spacer dielectric layer on said drain side of said first material gate portion is not etched, and wherein said spacer dielectric layer on said source side of said first material gate portion is etched; and
   E. selectively growing a second material gate portion from said first material gate portion that is exposed on said source side;
   and wherein said dual material gate of said field effect transistor is comprised of said first material gate portion and said second material gate portion.

2. The method of claim 1, wherein said field effect transistor is a NMOSFET (N-channel Metal Oxide Semiconductor Field Effect Transistor), and wherein said second material gate portion has a larger work function than said first material gate portion.

3. The method of claim 2, wherein said first material gate portion is N+ doped polysilicon (Si), and wherein said second material gate portion is P+ doped polysilicon germanium (SiGe).

4. The method of claim 1, wherein said field effect transistor is a PMOSFET (P-channel Metal Oxide Semiconductor Field Effect Transistor), and wherein said second material gate portion has a smaller work function than said first material gate portion.

5. The method of claim 4, wherein said first material gate portion is P+ doped polysilicon (Si), and wherein said second material gate portion is P+ doped polysilicon germanium (SiGe).

6. The method of claim 1, wherein said BARC layer on top of said first material gate portion is comprised of silicon oxynitride (SiON), and wherein said spacer dielectric layer is etched off from said SiON during said step D, and wherein said second material gate portion is not grown on said SiON during said step E.

7. The method of claim 1, wherein said gate dielectric is a stacked gate dielectric comprised of a silicon nitride (SiN) layer deposited on top of a silicon dioxide ($SiO_2$) buffer layer.

8. The method of claim 1, wherein said heavy ions implanted into said spacer dielectric layer is comprised of one of nitrogen ions and argon ions.

9. The method of claim 1, wherein said spacer dielectric layer is comprised of silicon dioxide ($SiO_2$), and wherein said spacer dielectric layer is selectively etched in said step D using a hydrogen fluoride (HF) acid solution.

10. The method of claim 1, further including the step of etching said BARC layer and said spacer dielectric layer that remains on said drain side of said first material gate portion, after said step E.

11. The method of claim 1, wherein said second material gate portion is silicon germanium (SiGe) epitaxially grown in said step E using GSMBE (Gas Source Molecular Beam Epitaxy) and UHVCVD (Ultra High Vacuum Chemical Vapor Deposition) processes.

12. The method of claim 11, wherein said second material gate portion of silicon germanium (SiGe) is in-situ doped with boron during said epitaxial growth of said silicon germanium such that said silicon germanium is $P^+$ doped.

13. The method of claim 1, wherein said field effect transistor is a JFET (Junction Field Effect Transistor).

14. The method of claim 1, wherein said field effect transistor is a HJFET (Heterostructure Junction Field Effect Transistor).

15. A method for fabricating a dual material gate of a NMOSFET (N-channel Metal Oxide Semiconductor Field Effect Transistor), the method including the steps of:

a. forming a polysilicon gate portion on a gate dielectric, said polysilicon gate portion having a source side and a drain side, and said polysilicon gate portion having a silicon oxynitride (SiON) layer on top of said polysilicon gate portion, wherein said gate dielectric is a stacked gate dielectric comprised of a silicon nitride (SiN) layer deposited on top of a silicon dioxide ($SiO_2$) buffer layer;

B. depositing a spacer dielectric layer of silicon dioxide ($SiO_2$) on top of said SiON layer, and on said source side and said drain side of said polysilicon gate portion;

C. implanting nitrogen ions into said spacer dielectric layer at an angle such that said spacer dielectric layer at said drain side of said polysilicon gate portion is substantially not implanted with said nitrogen ions;

D. selectively etching said spacer dielectric layer using a hydrogen fluoride (HF) acid solution, wherein any portion of said spacer dielectric layer implanted with said nitrogen ions is etched, and wherein said spacer dielectric layer on said drain side of said polysilicon gate portion is not etched, and wherein said spacer dielectric layer on said source side of said polysilicon gate portion is etched;

E. selectively growing a polysilicon germanium gate portion from said polysilicon gate portion that is exposed on said source side, and wherein said polysilicon germanium is epitaxially grown using gas source molecular beam epitaxy (GSMBE) and ultra high vacuum chemical vapor deposition (UHVCVD) processes, and wherein said polysilicon germanium (SiGe) is in-situ doped with boron during said epitaxial growth of said polysilicon germanium such that said polysilicon germanium gate portion is $P^+$ doped; and F. etching said silicon oxynitride layer on top of said polysilicon gate portion and said spacer dielectric layer that remains on said drain side of said polysilicon gate portion, after said step E;

and wherein said dual material gate of said field effect transistor is comprised of said polysilicon gate portion and said polysilicon germanium gate portion.

* * * * *